United States Patent
Hwang et al.

(10) Patent No.: US 7,825,699 B2
(45) Date of Patent: Nov. 2, 2010

(54) RECEIVER CIRCUIT HAVING COMPENSATED OFFSET VOLTAGE

(75) Inventors: Tae-Jin Hwang, Gyeonggi-do (KR);
Kun-Woo Park, Gyeonggi-do (KR);
Yong-Ju Kim, Gyenoggi-Do (KR);
Joon-Woon Kim, Gyeonggi-do (KR);
Hee-Woong Song, Gyeonggi-do (KR);
Ic-Su Oh, Gyeonggi-do (KR);
Hyung-Soo Kim, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 184 days.

(21) Appl. No.: 11/822,503

(22) Filed: Jul. 6, 2007

(65) Prior Publication Data

US 2008/0061840 A1 Mar. 13, 2008

(30) Foreign Application Priority Data

Sep. 13, 2006 (KR) ........................ 10-2006-0088745

(51) Int. Cl.
*G01R 19/00* (2006.01)
*G11C 7/00* (2006.01)
*H03F 3/45* (2006.01)

(52) U.S. Cl. ........................ 327/55; 327/307
(58) Field of Classification Search ............. 327/51–55, 327/307

See application file for complete search history.

(56) References Cited

U.S. PATENT DOCUMENTS

| 5,703,513 | A | 12/1997 | Hashizume et al. |
| 5,926,434 | A | 7/1999 | Mori |
| 6,232,811 | B1 | 5/2001 | Ihm |
| 6,282,129 | B1 * | 8/2001 | Khoury et al. ......... 365/189.16 |
| 6,529,423 | B1 | 3/2003 | Yoon et al. |
| 6,538,476 | B2 * | 3/2003 | Forbes .......................... 327/57 |
| 2005/0237088 | A1 * | 10/2005 | Burleson et al. ............... 327/51 |
| 2006/0132191 | A1 * | 6/2006 | Palmer ......................... 327/52 |
| 2006/0244479 | A1 * | 11/2006 | Major .......................... 326/29 |
| 2007/0182458 | A1 * | 8/2007 | Park et al. ..................... 327/51 |

FOREIGN PATENT DOCUMENTS

| JP | 9074337 | 3/1997 |
| KR | 10-1999-0007916 | 3/1999 |
| KR | 1020040008819 | 1/2004 |
| KR | 1020050078266 | 8/2005 |

* cited by examiner

*Primary Examiner*—Quan Tra
(74) *Attorney, Agent, or Firm*—Venable, LLP; Jeffri A. Kaminski; Todd R. Farnsworth

(57) ABSTRACT

A receiver circuit includes an offset control signal generating unit that outputs a plurality of offset control signals using an offset voltage. A sense amplifier receives a first current and a second current generated on the basis of an up input signal and a down input signal, respectively, converts the first current and the second current into an up compensating signal and a down compensating signal having electric potentials compensating the offset voltage, and amplifies the up compensating signal and the down compensating signal to output an up output signal and a down output signal.

5 Claims, 4 Drawing Sheets

RECEIVER CIRCUIT HAVING COMPENSATED OFFSET VOLTAGE

CROSS-REFERENCE TO RELATED PATENT APPLICATION

This application claims the benefit of Korean Patent Application No. 10-2006-0088745, filed on Sep. 13, 2006, in the Korean Intellectual Property Office, the disclosure of which is incorporated herein in its entirety by reference.

BACKGROUND OF THE INVENTION

1. Technical Field

The present invention relates to a receiver circuit, and in particular, to a receiver circuit that amplifies input data.

2. Related Art

Generally, a receiver circuit in a semiconductor integrated circuit is used to amplify data by increasing the voltage swing when input data is transmitted to an output terminal.

Such a receiver circuit includes a sense amplifier 100 and a latch unit 200, as shown in FIG. 1.

The sense amplifier 100 receives an up input signal IN and a down input signal INb and outputs an up output signal OUT and a down output signal OUTb in response to a clock signal CLK. Such a sense amplifier 100 includes an input unit to which the up input signal IN and the down input signal INb are input, an amplifying unit that amplifies the up input signal IN and the down input signal INb input through the input unit, and a driving unit that drives the amplifying unit. Each of the input unit, the amplifying unit, and the driving unit may include a plurality of NMOS transistors and a plurality of PMOS transistors.

The latch unit 200 latches the up output signal OUT and the down output signal OUTb output from the sense amplifier 200 so as to be fully swung, thereby generating output data RXDATA.

At that time, the sense amplifier, specifically, the input unit of the sense amplifier to which signals having opposite phases are input may include a pair of transistors having the same size.

However, even though the pair of transistors that configures the input unit is designed to have the same size, the component sizes of the transistor (for example, channel length, or channel width) may be varied during the manufacturing process, which generates an offset voltage.

Further, the sense amplifier is designed to perform amplification operating when voltages having opposite phases are input to the input unit thereof. In this case, unexpected noise may be input to any one of the transistors of the input unit, which causes malfunction of the transistor.

The offset voltage and noise may cause malfunction of the input unit of the sense amplifier such that an electric potential at the connection node of the input unit and the amplifying unit is changed, which results in the malfunction of the entire sense amplifier.

SUMMARY OF THE INVENTION

An embodiment of the present invention provides a receiver circuit that is capable of preventing the malfunction of a sense amplifier.

Another embodiment of the present invention provides a receiver circuit that is capable of preventing the malfunction caused by an offset voltage or noise.

According to an embodiment of the present invention, a receiver circuit includes an offset control signal generating unit that outputs a plurality of offset control signals using an offset voltage; and a sense amplifier that receives a first current and a second current generated on the basis of an up input signal and a down input signal, respectively, converts the first current and the second current into an up compensating signal and a down compensating signal having electric potentials compensating the offset voltage, and amplifies the up compensating signal and the down compensating signal to output an up output signal and a down output signal.

According to another embodiment of the invention, a receiver circuit includes a sense amplifier that includes an up signal input unit and a down signal input unit and amplifies signals input through the up signal input unit and the down signal input unit; an offset control signal generating unit that outputs a plurality of offset control signals by an offset voltage that is caused by a difference between input signals of the sense amplifier; a current converting unit that converts the up input signal and the down input signal input to the sense amplifier into the first and second currents; a signal input unit that receives the first and second currents, generates an up compensating signal and a down compensating signal in response to the offset control signal to supply to the up signal input unit and the down signal input unit; and a latch unit that latches the result that amplifies the up compensating signal and the down compensating signal to generate output data.

DESCRIPTION OF EXEMPLARY EMBODIMENT

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
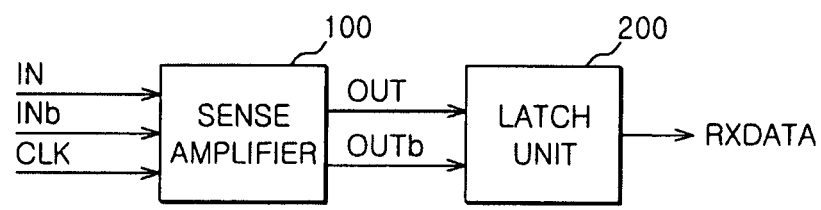
FIG. 1 is a block diagram showing a general receiver circuit of a semiconductor integrated circuit.
Figure 2:
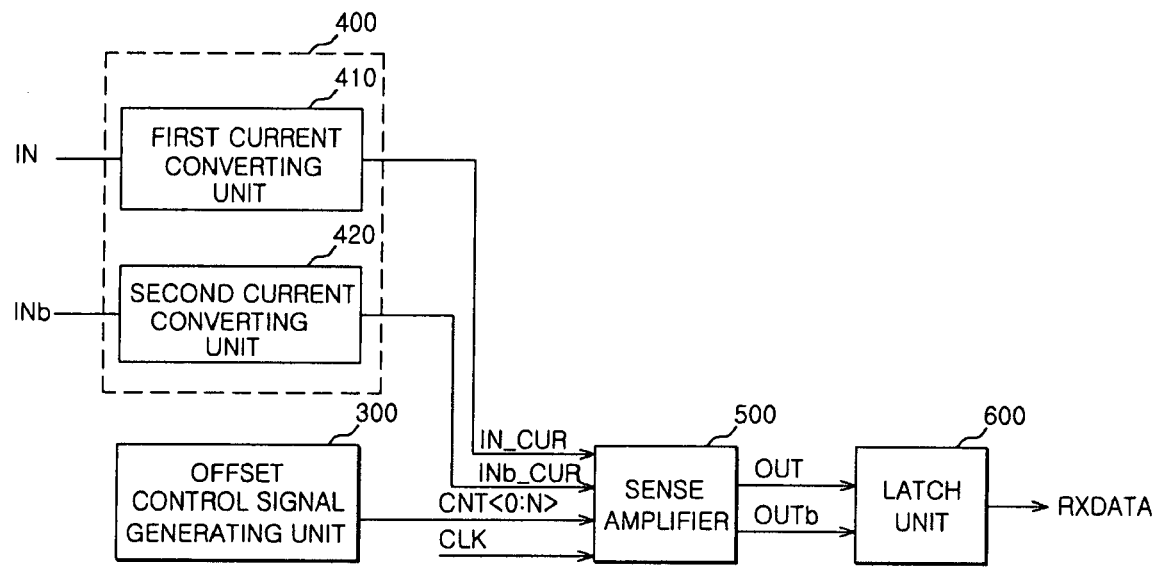
FIG. 2 is a block diagram showing a receiver circuit of a semiconductor integrated circuit according to an embodiment of the present invention.

Referring to FIG. 2, a receiver circuit according to an embodiment includes an offset control signal generating unit 300, a current converting unit 400, a sense amplifier 500, and a latch unit 600.

Figure 3:
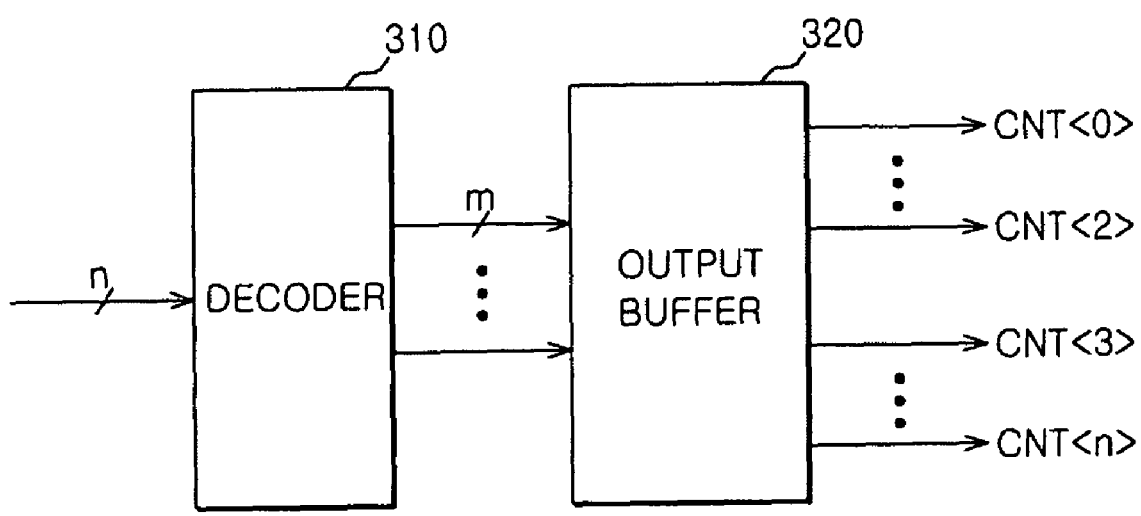
FIG. 3 is a block diagram showing an offset control signal generating unit according to an embodiment of the present invention.

The offset control signal generating unit 300 outputs a plurality of offset control signals CNT<0:N>. The offset voltage may be a voltage difference caused by the offset of the transistors configuring the sense amplifier 400. The number of offset control signals CNT<0:N> to be activated may change depending on the level of the offset voltage. The offset control signal generating unit 300 includes a decoder 310 and an output buffer 320, as shown in FIG. 3. The decoder 310 receives the offset voltage N to generate a plurality of signals M. The output buffer 320 receives the plurality of signals M supplied from the decoder 310 to generate the offset control signals CNT<0:N>.

The current converting unit 400 converts an up input signal IN and a down input signal INb, which are input to a pad (not shown), into a first current IN_CUR and a second current INb_CUR. The current converting unit 400 includes a first current converting unit 410 and a second current converting unit 420. The first current converting unit 410 converts the up input signal IN into the first current IN_CUR, and the second current converting unit 420 converts the down input signal INb into the second current INb_CUR. A typical converter that converts a voltage into a current may be used as the first and second converting units 410 and 420.

The sense amplifier 500 converts the currents IN_CUR and INb_CUR supplied from the current converting unit 400 into an up compensating signal and a down compensating signal having an electric potential that compensates the offset voltage on the basis of the offset control signals CNT<0:N>. Further, the sense amplifier 500 amplifies the up compensating signal and the down compensating signal to generate an up output signal OUT and a down output signal OUTb.

Figure 4:
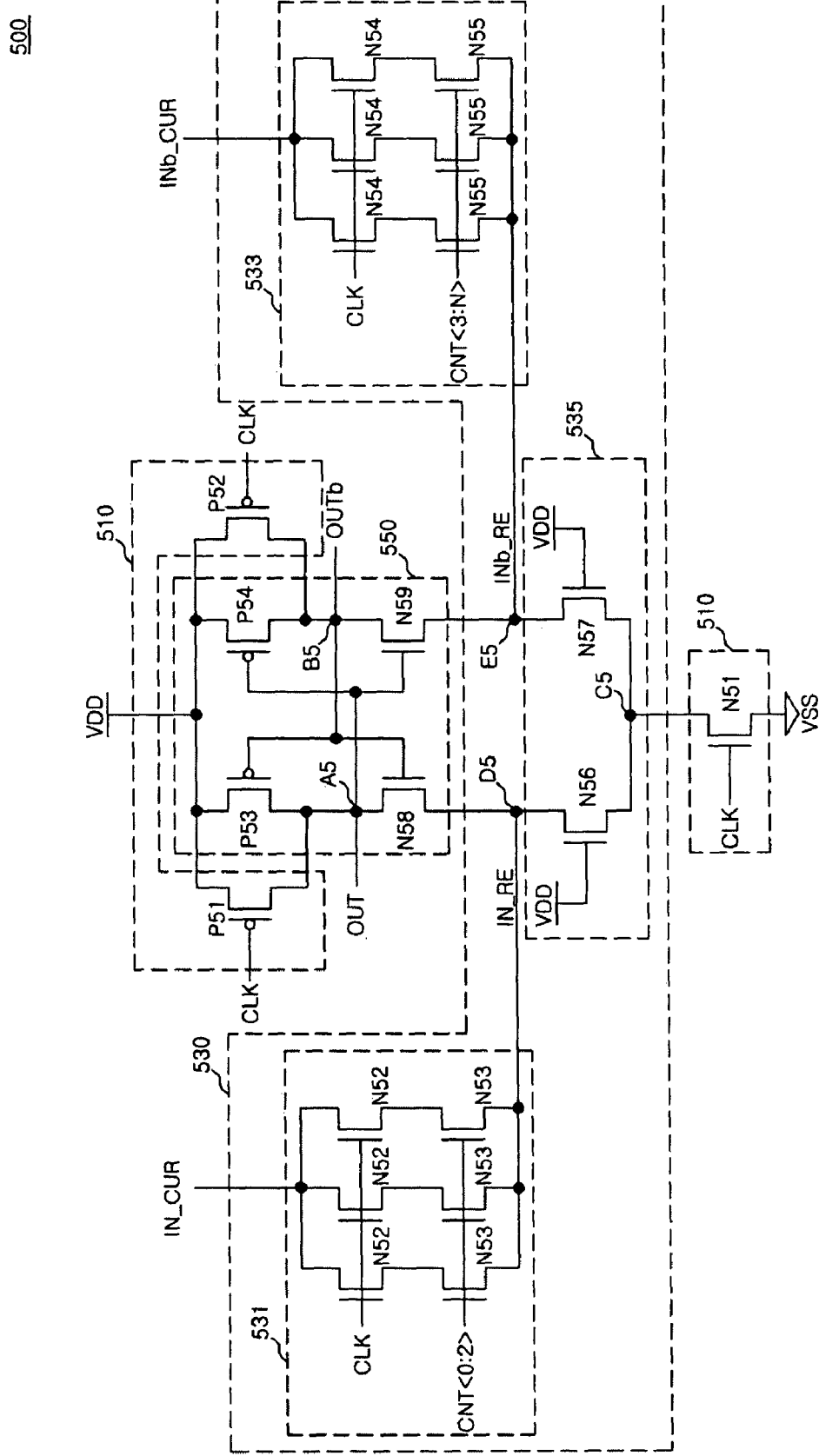
FIG. 4 is a detailed circuit diagram showing a sense amplifier according to an embodiment of the present invention.

Such a sense amplifier 500 includes a driving unit 510, a signal input unit 530, and an amplifying unit 550, as shown in FIG. 4.

The driving unit 510 preferably includes a first transistor P51, a second transistor P52, and a third transistor N51. The first transistor P51 includes a gate to which the clock signal CLK is input, a source applied with an external voltage VDD, and a drain that is connected to the amplifying unit 550. The second transistor P52 includes a gate to which the clock signal CLK is input, a source applied with an external voltage VDD, and a drain that is connected to the amplifying unit 550. The third transistor N51 includes a gate to which the clock signal CLK is input, a drain that is connected to the signal input unit 530, and a source applied with a ground voltage VSS. In this case, the first and second transistors P51 and P52 may be PMOS transistors, and the third transistor N51 may be a NMOS transistor. Preferably, the drain of the first transistor P51 is connected to a first output terminal output the up signal OUT in the amplifying unit 550, and the source of the second transistor P52 is connected to a second output terminal output the down signal OUTb in the amplifying unit 550.

The signal input unit 530 receives the first current IN_CUR and the second current INb_CUR to generate the up compensating signal IN_RE and the down compensating signal INb_RE in response to the clock signal CLK and the offset control signals CNT<0:2>. The up compensating signal IN_RE and the down compensating signal INb_RE are obtained by varying the resistances in current paths through which the first current IN_CUR and the second current INb_CUR flow. The signal input unit 530 may include a first signal input section 531, a second signal input section 533, and a signal transmitting section 535.

The first signal input section 531 controls the resistance in the first current path through which the first current IN_CUR flows, in response to the clock signal CLK and the offset control signals CNT<0:2> to output the up compensating signal IN_RE. The first signal input section 531 may include a plurality of fourth transistors N52 that operate in respond to the clock signal CLK and a plurality of fifth transistors N53 that operate in respond to the offset control signals CNT<0:2>. The plurality of fourth transistors N52, for example, three fourth transistors N52 are connected parallel to each other between the input terminal of the first current IN_CUR and the plurality of fifth transistors N53, and transmit the input first current IN_CUR to the fifth transistors N53 according to the level of the clock signal CLK. The plurality of fifth transistors N53, for example, three fifth transistors N53 are connected parallel to each other between the plurality of fourth transistors N52 and the signal transmitting section 535, and transmit the current transmitted from the fourth transistors N52 to the signal transmitting section 535 on the basis of the offset control signals CNT<0:2>. In this case, the offset control signals CNT<0:2> are selectively enabled so that the fifth transistors N53 selectively operate to output the up compensating signal IN_RE that compensates the offset voltage of the sense amplifier 500.

As similar to the first signal input section 531, the second signal input section 533 controls the resistance in the second current path through which the second current INb_CUR flows, in response to the clock signal CLK and the offset control signals CNT<3:N> to output the down compensating signal INb_RE. The second signal input section 533 includes a plurality of sixth signals N54 that operate in respond to the clock signal CLK and a plurality of seventh transistors N55 that operate in respond to the offset control signals CNT<3:N>. The plurality of sixth transistors N54, for example, three sixth transistors N54 are connected parallel to each other between the input terminal of the second current INb_CUR and the plurality of seventh transistors N55, and transmit the input second current INb_CUR to the seventh transistors N55 according to the level of the clock signal CLK. The plurality of seventh transistors N55, for example, three seventh transistors N55 are connected parallel to each other between the plurality of sixth transistors N54 and the signal transmitting section 535, and transmit the current transmitted from the sixth transistors N54 to the signal transmitting section 535 on the basis of the offset control signals CNT<3:N>. In this case, the offset control signals CNT<3:N> are selectively enabled so that the seventh transistors N55 selectively operate to output the down compensating signal INb_RE that compensates the offset voltage of the sense amplifier 500. In this case, the transistors configuring the first and second signal input sections 531 and 533 are preferably NMOS transistors.

Figure 5:
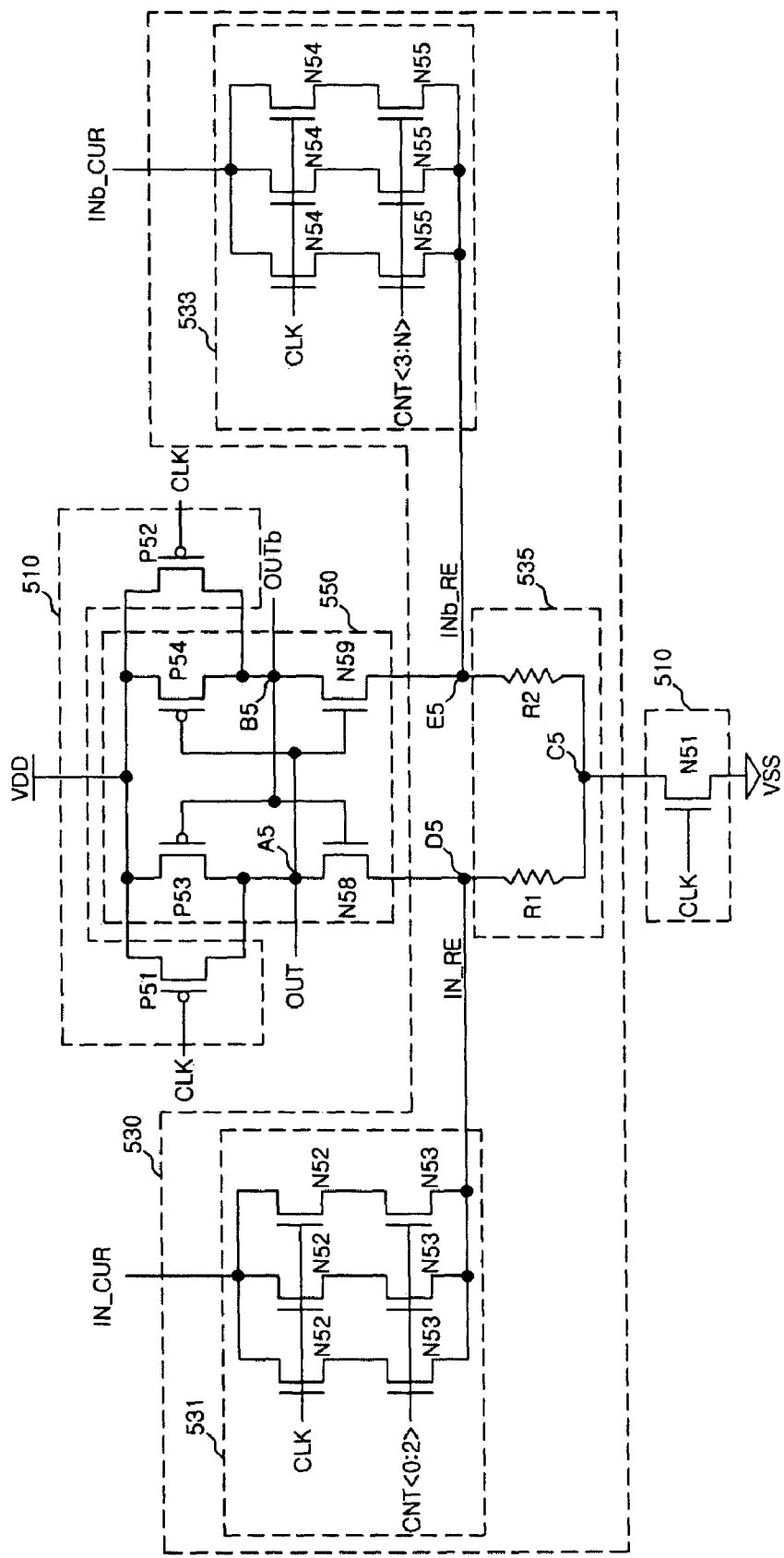
FIG. 5 is a detailed circuit diagram showing a sense amplifier according to another embodiment of the present invention.

The signal transmitting section 535 may include eighth and ninth transistors N56 and N57. The eighth transistor N56 is continuously turned on to transmit the up compensating signal IN_RE supplied from the first signal input section 531 to the third transistor N51 of the driving unit 510. The eighth transistor N56 includes a gate applied with an external voltage VDD, a drain applied with the up compensating signal IN_RE, and a source that is connected to the third transistor N51 of the driving unit 510. The ninth transistor N57 is also continuously turned on to transmit the down compensating signal INb_RE supplied from the second signal input section 533 to the third transistor N51 of the driving unit 510. The ninth transistor N57 includes a gate applied with an external voltage VDD, a drain applied with the down compensating signal INb_RE, and a source that is connected to the third transistor N51 of the driving unit 510. In this case, the eighth and ninth transistors of the signal transmitting section 535 are continuously turned on, and may be substituted by resistors R1 and R2 as shown in FIG. 5.

According to this embodiment, the first signal input section 531 receives three offset signals CNT<0:2>, and the second signal input section 533 receives three offset signals CNT<3:N> (in this case, N=5). However, a larger number of offset control signals may be generated so as to compensate a minute offset voltage.

The amplifying unit 550 amplifies the up compensating signal IN_RE and the down compensating signal INb_RE to generate the up output signal OUT and the down output signal OUTb. The amplifying unit 550 may include a tenth transistor P53, an eleventh transistor P54, a twelfth transistor N58, and a thirteenth transistor N59. The tenth transistor P53 and the twelfth transistor N58 are connected between an input terminal of the external voltage VDD and the signal input unit 530 to serve as an inverter. In this case, a source of the tenth transistor P53 is commonly connected to the source of the first transistor P51, and a drain of the tenth transistor P53 is commonly connected to the drain of the first transistor P51. Further, the eleventh transistor P54 and the thirteenth transistor N59 are also connected between the input terminal of the external voltage VDD and the signal input unit 530 to serve as an inverter. In this case, a source of the eleventh transistor P54 is commonly connected to the source of the second transistor P52, and a drain of the eleventh transistor P54 is commonly connected to the drain of the second transistor P52. An output signal of the inverter (hereinafter, first inverter) configured by the tenth and twelfth transistors P53 and N58 is provided to an input terminal of the inverter (hereinafter, second inverter) configured by the eleventh and thirteenth transistors P54 and N59. Further, an output signal of the second inverter configured by the eleventh and thirteenth transistors P54 and N59 is provided to an input terminal of the first inverter configured by the tenth and twelfth transistors P53 and N58. In that case, the output signal of the first inverter becomes the up output signal OUT that is, a first output signal of the sense amplifier 500. The output signal of the second inverter becomes the down output signal OUTb that is, a second output signal of the sense amplifier 500.

In the sense amplifier 500, reference A5 refers to a first output node of the amplifying unit 550, reference B5 refers to a second output node of the amplifying unit 550, and reference C5 refers to a connection node between the drain of the third transistor N51 and the signal input unit 530. Further, reference D5 refers to an output node of the first signal input section 531 and reference E5 refers to an output node of the second signal input section 532.

The latch unit 600 (FIG. 2) latches the up output signal OUT and the down output signal OUTb to generate output data RXDATA. A known SR latch is preferably used as the latch unit 600.

The operation of the receiver circuit having the above configuration will be described.

The up input signal IN and the down input signal INb serving as input data are converted into the first current IN_CUR and the second current INb_CUR in the current converting unit 400.

More specifically, the first current converting unit 410 and the second current converting unit 420 convert the up input signal IN and the down input signal INb into the first current IN_CUR and the second current INb_CUR, and the sense amplifier 500 is activated by the clock signal CLK.

The offset control signal generating unit 300 controls the number of offset control signals CNT<0:N> to be activated in response to the offset voltage. The first signal input section 531 and the second signal input section 533 output the first current IN_CUR and the second current INb_CUR as the up compensating signal IN_RE and the down compensating signal INb_RE in response to the offset control signals CNT<0:N>.

If two offset control signals CNT<0:1> among the offset control signals CNT<0:2> that are input to the first signal input section 531 are activated to be a high level, two fifth transistors N53 are turned on and the voltage level of the output up compensating signal IN_RE is determined by the resistance of the two fifth transistors N53 and the first current IN_CUR.

Further, if one offset control signal CNT<3> among the offset control signals CNT<3:5> that are input to the second signal input section 533 is activated to be a high level, one of seventh transistors N55 is turned on and the voltage level of the down compensating signal INb_RE is determined by the resistance of the seventh transistors N55 and the second current INb_CUR.

When the up compensating signal IN_RE and the down compensating signal INb_RE are input to the node D5 and the node E5, respectively, the amplifying unit 550 amplifies the up compensating signal IN_RE and the down compensating signal INb_RE to output the up output signal OUT and the down output signal OUTb.

If the level of the up compensating signal IN_RE is higher than that of the down compensating signal INb_RE, the gate-source voltage Vgs of the fifth transistor N53 is smaller than the gate-source voltage Vgs of the seventh transistor N55. Therefore, the amount of current that flows through the fifth transistor N53 is smaller than the amount of current that flows through the seventh transistor N55 and thus the electric potential of the first output node A5 is higher than that of the second output node B5. The electric potential at the first output node A5 allows a larger amount of current to flow through the thirteenth transistor N59 and the electric potential at the second output node B5 allows the external voltage VDD to be applied to the tenth transistor P53. As a result, a high level up output signal OUT is output from the first output node A5 and a low level down output signal OUTb is output from the second output node B5.

The latch unit 200 receives the up output signal OUT and the down output signal OUTb to be fully swung, and outputs the output data RXDATA.

As described above, according to the receiver circuit of the semiconductor memory apparatus according to an embodiment of the present invention, when an offset voltage is generated in the sense amplifier 300 and a noise is generated in the up input signal IN and the down input signal INb, the up input signal IN and the down input signal INb are converted into currents, and the resistance value in a path through which the currents flow is adjusted to compensate the offset voltage and the noise.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

Therefore, the receiver circuit of the semiconductor memory apparatus according to an embodiment of the present invention is capable of compensating an offset voltage caused by changes in a voltage and a temperature during the process, and prevent the deterioration in the performance of the receiver circuit.

What is claimed is:

1. A receiver circuit, comprising:
   a sense amplifier that includes an up signal input unit and a down signal input unit and amplifies signals input through the up signal input unit and the down signal input unit;
   an offset control signal generating unit that outputs a plurality of offset control signals using an offset voltage that is caused by a difference between the signals input to the sense amplifier;

a current converting unit that converts an up input signal and a down input signal to be input to the sense amplifier into the first and second currents;

a signal input unit that receives first and second currents, generates an up compensating signal and a down compensating signal in response to the offset control signal for supply to the up signal input unit and the down signal input unit; and a latch unit that latches a result that amplifies the up compensating signal and the down compensating signal to generate output data.

2. The receiver circuit of claim 1, wherein the signal input unit changes resistances in current paths of the first current and the second current in response to the offset control signals to output the up compensating signal and the down compensating signal.

3. The receiver circuit of claim 1, wherein the signal input unit includes:

a first signal input section that controls a resistance in a first current path through which the first current flows, in response to the offset control signal to output the up compensating signal; and a second signal input section that controls a resistance in a second current path through which the second current flows, in response to the offset control signal to output the down compensating signal.

4. The receiver circuit of claim 3, wherein the first signal input section includes a plurality of transistors having gate, source and drain terminals and that are connected parallel to each other and receive respective ones of the offset control signal at respective gate terminals, and a current flows from a drain terminal of each of the transistors to a respective source terminal thereof.

5. The receiver circuit of claim 3, wherein the second signal input section includes a plurality of transistors having gate, source, and drain terminals and that are connected parallel to each other and receive a respective one of the offset control signals at respective gate terminals, and a current flows from a respective drain terminal of each of the transistors to a respective source terminal thereof.

\* \* \* \* \*